United States Patent
Stephens et al.

(10) Patent No.: US 6,833,757 B2
(45) Date of Patent: Dec. 21, 2004

(54) METHOD AND SYSTEM FOR IMPROVING AMPLIFIER EFFICIENCY

(75) Inventors: Randall J. Stephens, Richardson, TX (US); Teddy D. Thomas, Dallas, TX (US)

(73) Assignee: Texas Instruments Incorporated, Dallas, TX (US)

( * ) Notice: Subject to any disclaimer, the term of this patent is extended or adjusted under 35 U.S.C. 154(b) by 143 days.

(21) Appl. No.: 09/727,060

(22) Filed: Nov. 30, 2000

(65) Prior Publication Data

US 2001/0030577 A1 Oct. 18, 2001

Related U.S. Application Data

(60) Provisional application No. 60/171,078, filed on Dec. 15, 1999.

(51) Int. Cl.[7] .............................. H03F 1/24; H03F 1/36
(52) U.S. Cl. ...................... 330/100; 330/207 A; 330/75
(58) Field of Search ........................... 330/100, 207 A, 330/75, 251

(56) References Cited

U.S. PATENT DOCUMENTS 5,077,539 A * 12/1991 Howatt ........................ 330/10
5,617,058 A * 4/1997 Adrian et al. ................. 330/10
6,005,316 A * 12/1999 Harris ........................ 310/90.5
6,229,389 B1 * 5/2001 Pullen et al. ................. 330/10
6,229,390 B1 * 5/2001 Delano et al. .............. 330/107

OTHER PUBLICATIONS

"A High Efficiency Low Distortion Audio Power Amplifier", 103rd Convention 1997 Sep. 26–29, New York.

Choi, et al., "A Design of a 10–W Single–Chip Class D Audio Amplifier with Very High Efficiency Using CMOS Technology", 1999 IEEE, pp. 465–472.

* cited by examiner

Primary Examiner—Patricia Nguyen
(74) Attorney, Agent, or Firm—Wade James Brady, III; Frederick J. Telecky, Jr.

(57) ABSTRACT

One aspect of the invention is an amplifier (10), comprising an input stage amplifier (20) coupled to an output node (81). The amplifier (10) further comprises a class D output stage (50), which comprises at least two switching elements (P1, N1) and coupled to the output node (81). The amplifier (10) also comprises a control circuit (40) coupled to the output stage (50). The control circuit (40) is operable to produce a tri-state output of the output stage (50) in response to a sensed value proportional to an amount of current that flows to the output node (81).

14 Claims, 2 Drawing Sheets

METHOD AND SYSTEM FOR IMPROVING AMPLIFIER EFFICIENCY

This application claims priority under 35 USC §119(e) (1) of provisional application No. 60/171,078 filed Dec. 15, 1999.

TECHNICAL FIELD OF THE INVENTION

This invention relates generally to the field of amplifier circuits and more particularly to a method and system for improving amplifier efficiency.

BACKGROUND OF THE INVENTION

Amplifiers are used to increase or decrease voltage levels in many applications. Proper amplifier design, whether within discrete or integrated circuits, often involves tradeoffs of amplifier characteristics such as efficiency and distortion. Thus, in many applications where low distortion is desirable, performance may suffer from low amplifier efficiency.

Conventional amplifiers, including audio amplifiers, may employ a plurality of stages in order to improve amplifier performance. For example, some amplifier designs may utilize both an input stage that features characteristics such as low distortion and an output stage that resembles a class D stage that typically features higher efficiency. Such a combination may improve the total efficiency of the amplifier. However, such conventional designs may not sufficiently improve amplifier efficiency to meet a desired level of performance. For example, these conventional designs may still suffer from low signal-to-noise ratios and/or dynamic range. Therefore, it is desirable to provide a mechanism for improving amplifier efficiency while maintaining low distortion.

SUMMARY OF THE INVENTION

From the foregoing, it may be appreciated that a need has arisen for providing a system and method to improve efficiency for amplifier applications. In accordance with the present invention, a system and method are provided that substantially eliminate or reduce disadvantages and problems of conventional amplifier systems.

According to an embodiment of the present invention, there is provided an amplifier with an input stage amplifier coupled to an output node. The amplifier includes a class D output stage having at least two switching elements and coupled to the output node. The amplifier also includes a control circuit coupled to the output stage. The control circuit is operable to produce a tri-state output of the output stage in response to a sensed value proportional to an amount of current that flows to the output node. More specifically, the amplifier may comprise an audio amplifier. In another embodiment of the invention, the input stage amplifier may comprise a class AB amplifier.

The invention provides various technical advantages over conventional amplifier systems. Various embodiments of the invention may have none, some, or all of these advantages. For example, one technical advantage is to reduce switching losses of amplifiers, both in systems comprising discrete components and in integrated circuits. This advantage may increase the signal-to-noise ratio and the dynamic range of the amplifier. Another technical advantage may also be reducing electromagnetic interference of the amplifier. Yet another technical advantage may be improved power consumption over amplifiers utilizing conventional approaches.

Other technical advantages may be readily ascertainable by those skilled in the art from the following figures, description, and claims.

BRIEF DESCRIPTION OF THE DRAWINGS

For a more complete understanding of the present invention and the advantages thereof, reference is now made to the following description taken in connection with the accompanying drawings, wherein like reference numerals represent like parts, in which.

DETAILED DESCRIPTION OF THE INVENTION

Figure 1:
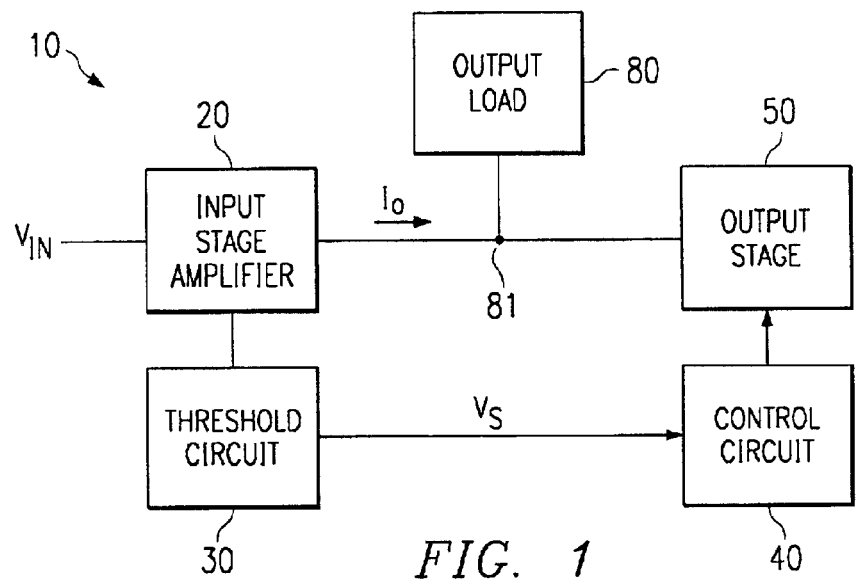
FIG. 1 illustrates a block diagram of an amplifier system.

FIG. 1 illustrates a block diagram of an amplifier system 10. Amplifier 10 includes an input stage amplifier 20 coupled to an input voltage $V_{IN}$, a threshold circuit 30 and an output load 80. Amplifier system 10 also includes a control circuit 40 coupled to threshold circuit 30 and to output stage 50. Output stage 50 is also coupled to output load 80. Although direct connections are illustrated for various elements, many elements may be coupled through other elements without departing from the scope of the invention. As further detailed below, control circuit 40 may be coupled to and may control any class D output stage 50. Control circuit 40 is operable to control the current flowing to output load 80 by activating and deactivating switches within output stage 50 in response to a measured value that senses the amount of current flowing to output load 80. Such control of current flowing to output load 80 may improve the efficiency of amplifier system 10.

Input stage amplifier 20 controls a voltage at output node 81 and provides a current $I_O$ to output load 80. Input stage amplifier 20 may include any suitable input amplifier stage operable to provide current $I_O$ to output load 80. For example, in audio applications where low distortion may be desirable, input stage amplifier 20 may comprise a class A or class AB input stage amplifier, and/or output load 80 may comprise an audio speaker.

Threshold circuit 30 senses the current $I_O$ flowing to output load 80 from input stage amplifier 20 and produces a sensed value. Current $I_O$ may be represented as a positive current as it flows from input stage 20 to output load 80 and a negative current in the opposite direction. Threshold circuit 30 may include one or multiple stages with a response time suitable for closed loop control of output stage 50. In one embodiment of the invention, threshold circuit 30 may include an adjustable threshold used to generate the sensed value.

In response to the sensed value, control circuit 40 controls the current $I_O$ flowing to output load 80 by activating and deactivating switches within output stage 50. Control circuit 40 includes logic to generate a control signal that controls output stage 50 in response to the sensed value. Output stage 50 may include any switching, or class D, stage suitable to drive output load 80. Any types of switching elements may be used in output stage 50. In this embodiment and as is described below, output stage 50 includes MOSFET switches P1 and N1.

In operation, the magnitude and direction of current $I_O$ as measured at output node 81 may vary as a function of voltage input $V_{IN}$. Control circuit 40 operates to control current $I_O$ by providing tri-state control of the switches within output stage 50. For example, control circuit 40 may desirably deactivate both switches P1 and N1 for any current $I_O$ whose magnitude drops below a desired threshold. Where the magnitude of negative current $I_O$ exceeds such a threshold, control circuit 40 activates switch N1 and deactivates switch P1. Similarly, where the magnitude of positive current $I_O$ exceeds the threshold, control circuit 40 activates switch P1 and deactivates switch N1. The switches in output stage 50 are thus controlled so that output stage 50 comprises three possible states, or on-off-on, as a function of current $I_O$. Such control may advantageously dissipate little or no power through switches P1 and N1 when current $I_O$ diminishes to approximately zero. Threshold circuit 30 and control circuit 40 may utilize any configuration and threshold suitable to achieve such tri-state control within the closed loop delay for current $I_O$ to travel from input stage amplifier 20 to output load 80.

Figure 2:
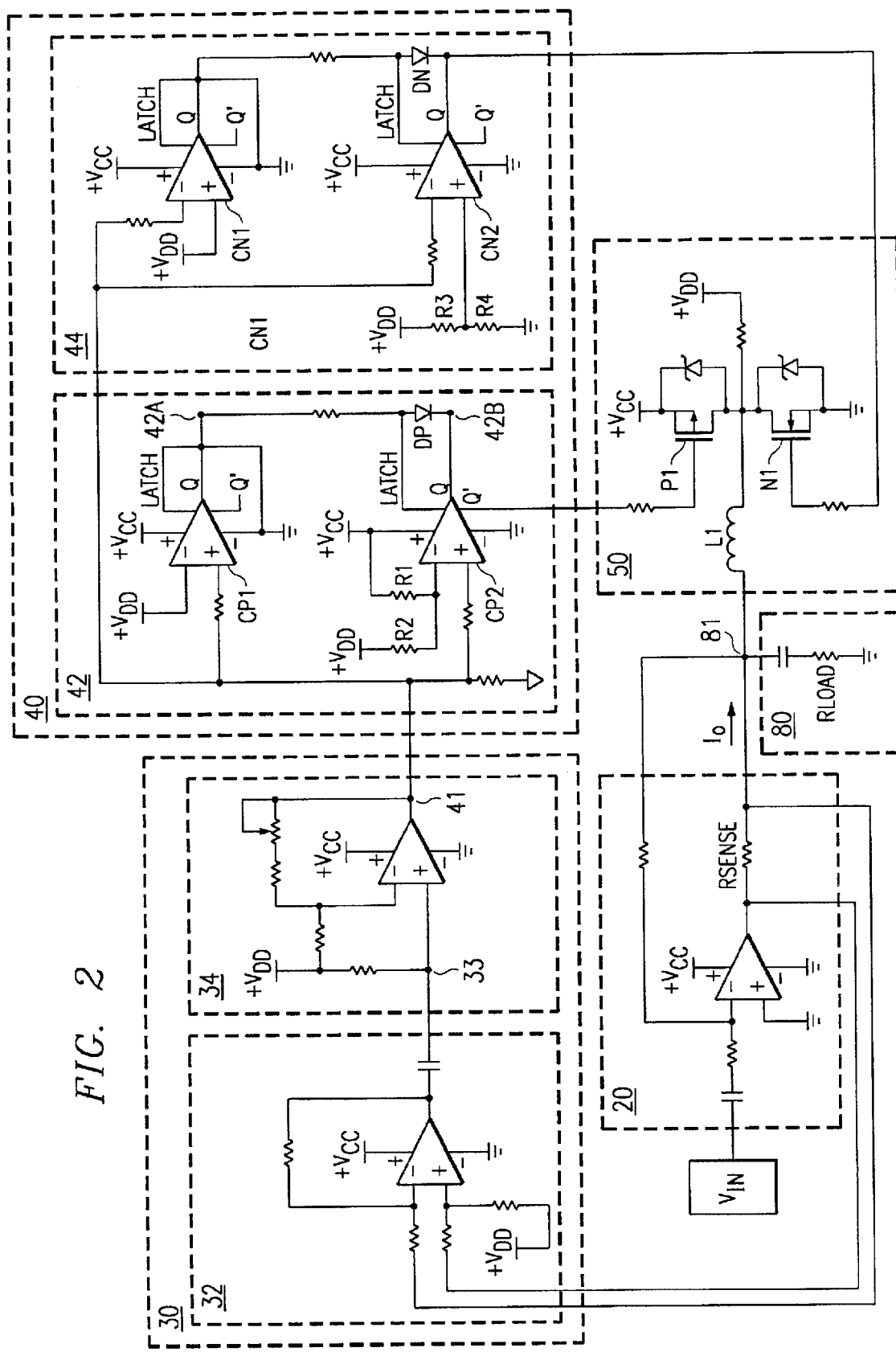
FIG. 2 illustrates an exemplary schematic diagram of the amplifier system.

FIG. 2 illustrates an exemplary schematic diagram of amplifier system 10 utilizing the teachings of the present invention. Amplifier system 10 includes input amplifier stage 20, threshold circuit 30, control circuit 40, and output load 80, as is discussed in conjunction with FIG. 1. Although direct connections are illustrated for various elements, many elements may be coupled through other elements without departing from the scope of the invention. Amplifier system 10 may be an integrated circuit or discrete components.

In this embodiment, input amplifier stage 20 is designed as a class AB input stage amplifier coupled to voltage input $V_{IN}$. Input amplifier stage 20 is configured with gain suitable to couple to a resistive output load 80 such as an audio speaker. In this embodiment, input amplifier stage 20 also includes a sense resistor Rsense coupled to output node 81 through which current $I_O$ flows to output load 80. Threshold circuit 30 couples to input stage amplifier 20 at each end of resistor Rsense. Threshold circuit 30 may also couple to resistors internal to input stage amplifier 20.

Output stage 50 has a p-channel MOSFET switch P1 and an n-channel MOSFET switch N1. The drains of switches P1 and N1 are each coupled to output load 80 through an inductor L1. Inductor L1 stores energy transferred from switches P1 and N1 and isolates output stage 50 from input stage amplifier 20. As discussed in further detail below, control circuit 40 may be used to activate and deactivate switches P1 and N1 to control current flow to output load 80.

In this embodiment, output load 80 is designed as an audio speaker. Control circuit 40 may be used to deactivate switches P1 and N1 for small signal output levels. Such an advantage may reduce electromagnetic interference, switching losses, and lower the noise floor for small signal output levels. Output loads that may require inductive coupling to output stage 50, such as motors, may also be used. Other output loads 80 that may be driven by output stage 50, with or without inductor L1, are also within the scope of the invention.

Threshold circuit 30 has a differential amplifier 32 coupled to threshold adjustor 34 at node 33. Threshold circuit 30 is coupled to control circuit 40 at node 41. Differential amplifier 32 is configured with a gain suitable to amplify the voltage potential $V_R$ across resistor Rsense and to produce an amplified voltage potential $V_A$ at node 33. In response to potential $V_A$ at node 33, threshold adjustor 34 is configured with a gain suitable to produce at node 41 a sensed value, voltage $V_P$, that is proportional to current $I_O$. Threshold adjustor 34 may also produce an adjustable voltage $V_P$ at node 41 by utilizing an adjustable gain configuration. For example, threshold adjustor 34 may use adjustable resistors or may be designed in fewer or more stages. For example, threshold circuit 30 may comprise a plurality of cascaded stages where more gain may be desirable. Other threshold circuits 30, including current mirrors and differential amplifiers, may also be used to sense current $I_O$ and to produce a sensed value therefrom, and are within the scope of the invention.

In this embodiment, control circuit 40 comprises two generally symmetric portions 42 and 44. For example, portion 42 couples to switch P1 of output stage 50 and uses comparators CP1 and CP2, a resistor divider R1 and R2, and diode DP. Portion 42 is responsive to a positive current $I_O$, when current is flowing from input stage 20 to output load 80. Portion 42 operates to activate switch P1 when positive current $I_O$ exceeds a positive threshold $I_{TH}$. Portion 42 operates to deactivate switch P1 when positive current $I_O$ diminishes below another threshold $V_{MR}$. For example, portion 42 may deactivate switch P1 when positive current $I_O$ reaches approximately zero. Comparators CP1 and CP2 are latch comparators with a Q and Q' output and whose positive reference nodes are each coupled to node 41. The Q' output of comparator CP2 drives the gate of switch P1.

The Q output of comparator CP1 couples to the latch input of comparator CP2 and to diode DP. A resistor divider formed by resistors R1 and R2 couples to reference voltages $V_{CC}$ and $V_{dd}$ to provide a suitable threshold voltage $V_{TH}$ for comparator CP2. In this embodiment, voltage $V_{TH}$ has a predetermined value that may be represented by the relationship:

$V_{TH} = V_{dd} + (V_{cc} - V_{dd}) * R2/(R2+R1)$

Voltage $V_{TH}$ and resistors R1 and R2 may also be adjustable.

In operation, portion 42 of control circuit 40 may control switch P1 by activating and deactivating switch P1. In this embodiment, portion 42 activates p-channel MOSFET P1 when output Q' of comparator CP2 is asserted low, and deactivates switch P1 when output Q' of comparator CP2 is asserted high. In this embodiment, portion 42 activates switch P1 only after voltage $V_P$ at node 41 has exceeded reference threshold $V_{TH}$ and until voltage $V_P$ decreases to reference threshold $V_{MR}$. In this embodiment, reference threshold $V_{MR}$ represents a predetermined value at the general midpoint between a high threshold $V_{TH}$ and a low threshold $-V_{TH}$, and is approximately equal to zero volts. Such control of switch P1 desirably reduces any losses through switch P1 for small positive currents $I_O$. Reducing any losses through switch P1 desirably reduces noise and electromagnetic interference, and thus increases the signal-to-noise ratio of amplifier 10.

To illustrate, comparator CP1 determines when voltage $V_P$ exceeds reference threshold $V_{MR}$. Comparator CP1 will remain asserted high while the voltage at node 41 remains above reference threshold $V_{MR}$. Comparator CP2 monitors the voltage $V_P$ at node 41 against reference threshold $V_{TH}$. The Q output of comparator CP2 is asserted high only when voltage $V_P$ exceeds reference threshold $V_{TH}$. As voltage $V_P$ drops below $V_{TH}$ but remains above $V_{MR}$, the latch signal from comparator CP1, now unblocked by diode DP, latches comparator CP2 in the logic high state. Thus, once $V_P$ exceeds reference threshold $V_{TH}$, output Q' of comparator CP2 will activate switch P1 as long as voltage $V_P$ remains above $V_{MR}$. However, as voltage $V_P$ drops below $V_{MR}$, output Q' is asserted low and thus deactivates switch P1. These voltage waveforms and their relationships are illustrated and discussed in further detail in conjunction with FIG. 3.

Portion 44 similarly couples to switch N1 of output stage 50 and includes comparators CN1 and CN2, another resistor divider R3 and R4, and diode DN. Portion 44 is responsive to a negative current $I_O$ which flows from output load 80 to input stage 20. Portion 44 operates to activate switch N1 when negative current $I_O$ exceeds a negative threshold $-I_{TH}$ and to subsequently deactivate switch N1 when negative current $I_O$ reaches approximately zero. Comparators CN1 and CN2 are latch comparators with a Q and Q' output and whose negative reference nodes are each coupled to node 41. The Q output of comparator CN2 drives the gate of switch N1.

The Q output of comparator CN1 couples to the latch input of comparator CN2 and to diode DN. Resistors R3 and R4 are coupled to reference voltage $V_{dd}$ and ground to form this resistor divider in order to provide a suitable threshold voltage $-V_{TH}$ for comparator CN2. In this embodiment, $-V_{TH}$ has a predetermined value that may be represented by the relationship:

$$-V_{TH}=V_{dd}*R4/(R3+R4)$$

Voltage $-V_{TH}$ and resistors R3 and R4 may also be adjustable.

In operation, portion 44 may control switch N1 by activating and deactivating switch N1. In this embodiment, portion 44 activates n-channel MOSFET N1 when output Q of comparator CN2 is asserted high, and deactivates switch N1 when output Q of comparator CN2 is asserted low. In this embodiment, portion 44 activates switch N1 only after voltage $V_P$ at node 41 has dropped below reference threshold $-V_{TH}$ and until voltage $V_P$ increases to reference threshold $V_{MR}$. Such control of switch N1 desirably reduces any losses through switch N1 for small negative currents $I_O$. Reducing any losses through switch N1 also desirably reduces noise and electromagnetic interference, and thus increases the signal-to-noise ratio of amplifier 10.

Comparators CN1 and CN2 monitor voltage $V_P$, and comparator CN1 determines when voltage $V_P$ drops below reference threshold $V_{MR}$. Comparator CN1 will remain asserted high while voltage $V_P$ remains below reference threshold $V_{MR}$. The Q output of comparator CN2 is asserted high only when voltage $V_P$ drops below reference threshold $-V_{TH}$. As voltage $V_P$ rises above $-V_{TH}$ but remains below $V_{MR}$, the latch signal from comparator CN1, now unblocked by diode DN, latches comparator CN2 in the logic high state. Thus, once $V_P$ drops below reference threshold $-V_{TH}$, comparator CN2 will activate switch N1, as long as voltage $V_P$ remains below $V_{MR}$. However, as voltage $V_P$ rises above $V_{MR}$, comparator CN2 is latched off and thus deactivates switch P1.

In this way, portions 42 and 44 of control circuit 40 combine to produce a tri-state, or on-off-on, output for output stage 50. Control circuit 40 controls output stage 50 utilizing voltage $V_P$ which is proportional to the magnitude of current $I_O$. Control circuit 40 deactivates both switches P1 and N1 when voltage $V_P$ rises from $V_{MR}$ until it reaches reference threshold $V_{TH}$, and when voltage $V_P$ decreases from $V_{MR}$ until it reaches reference threshold $-V_{TH}$. Once voltage $V_P$ exceeds reference threshold $V_{TH}$, control circuit 40 activates switch P1. Control circuit 40 deactivates switch P1 only when voltage $V_P$ drops to $V_{MR}$. Similarly, switch N1 is on, and switch P1 is off, once the voltage $V_P$ exceeds reference threshold $-V_{TH}$. Control circuit 40 deactivates switch N1 only when voltage $V_P$ rises to $V_{MR}$.

Other reference thresholds $V_{MR}$, which are proportional to current $I_O$, may also be used to control output stage 50 in response to current $I_O$. For example, $V_{MR}$ may comprise two suitable non-zero thresholds $V_{MRA}$ and $-V_{MRB}$, that are less than reference thresholds $V_{TH}$ and $-V_{TH}$, respectively. Such non-zero thresholds may accommodate the closed loop delay from resistor Rsense to output stage 50. For example, such non-zero thresholds may desirably ensure that switches P1 and N1 are timely deactivated where current $I_O$ is decreasing and measures a magnitude near-zero. Propagation or other delays do not prevent switches P1 and N1 from being timely deactivated to generally coincide when current $I_O$ is approximately zero. Such non-zero thresholds may also be similarly utilized for controlling switches P1 and N1 for generally non-zero currents $I_O$.

Reference thresholds $V_{MRA}$ and $-V_{MRB}$ also may or may not be identical for portions 42 and 44. Other reference thresholds $V_{TH}$ and $-V_{TH}$, which are proportional to current $I_O$, may be used as desired. For example, in audio applications, $V_{TH}$ may be used to deactivate switches P1 and N1 when current $I_O$ drops below a listener's aural threshold. Furthermore, reference thresholds $V_{TH}$ and $-V_{TH}$ may or may not have identical magnitudes, such as for applications where thresholds for positive and negative currents may desirably differ.

Control circuit 40 may also comprise any logic suitable for producing a tri-state output for output stage 50 in response to current $I_O$. For example, control circuit 40 may comprise a current-steering mechanism that may be used with any suitable threshold circuit 30, as discussed above.

Figure 3:
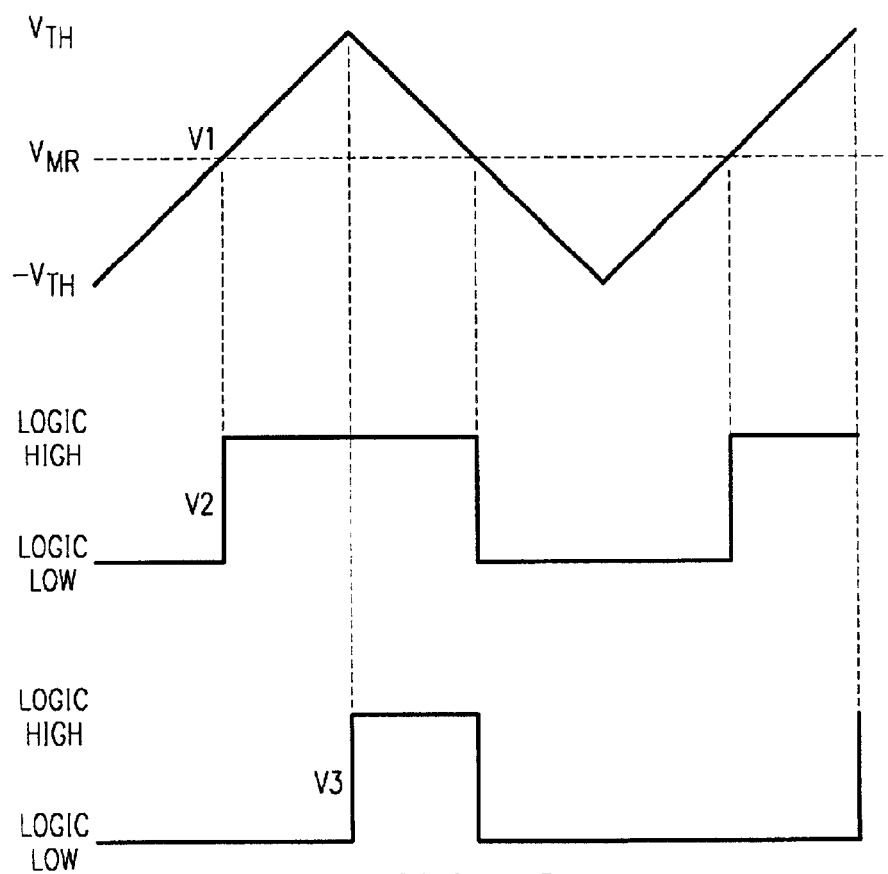
FIG. 3 illustrates a series of waveforms demonstrating the operation of the amplifier system.

FIG. 3 illustrates a series of waveforms demonstrating the operation of the present invention. Waveforms V1, V2, and V3 are measurable at nodes 41, 42A and 42B, respectively, as described in detail in conjunction with FIGS. 1 and 2. More specifically, waveforms V1, V2, and V3 describe the operation of portion 42 of control circuit 40. As discussed in conjunction with FIG. 2, portion 42 is responsive to changes in positive current $I_O$. The operation of portion 44 of control circuit 40 is not explicitly shown, but may be similarly illustrated, as is discussed below.

Waveform V1 illustrates the voltage level $V_P$ measurable at node 41 which is proportional to the voltage at output node 32 and thus current $I_O$. In the embodiment of FIG. 1, waveform V1 illustrates a typical output for a self-oscillating class D output stage coupled to an inductor between predetermined voltage reference thresholds $-V_{TH}$ and $V_{TH}$. In this embodiment, $V_{MR}$ represents the midpoint between reference thresholds $-V_{TH}$ and $V_{TH}$. Voltage thresholds $V_{MR}$ and $V_{TH}$ may be any suitable thresholds, whether predetermined or dynamically determined. For example, in many audio applications, $V_{MR}$ may be zero.

Waveforms V2 and V3 illustrate the change in logic high and low levels in response to changes in voltage $V_P$ at nodes 42A and 42B, respectively. As discussed in conjunction with FIG. 2, the logic level at node 42A follows the output of comparator CP1, while the logic level at node 42A follows the outputs of diode DP and comparator CP2. As voltage $V_P$ exceeds reference threshold voltage $V_{MR}$, comparator CP1 is set and reset, respectively. Thus, waveform V2 remains at an asserted high as long as voltage $V_P$ remains above reference threshold $V_{MR}$.

Waveform V3 illustrates the Q output of comparator CP2 at node 42B and reflects control latching by comparator CP1. Thus, switch P1 is activated when waveform V3 is at a logic high, because switch P1 is activated by a logic low from the Q' output of comparator CP2. Diode DP prevents comparator CP1 from latching comparator CP2 until the voltage exceeds reference threshold $V_{TH}$. Waveform V3 is then latched high by comparator CP1 as long as voltage $V_P$ remains above reference threshold $V_{MR}$. Comparator CP2 then follows waveform V2 as it drops when comparator CP1 is reset as voltage $V_P$ drops below reference threshold $V_{MR}$.

Portion 44 of control circuit 40 operates similarly to portion 42 and, as discussed in conjunction with FIG. 2, portion 42 is responsive to changes in negative current $I_O$. Thus, for example, similar waveforms V2' and V3' (not explicitly shown) would activate switch N1 where voltage $V_P$ is below reference threshold $-V_{TH}$, and deactivate switch N1 where voltage $V_P$ reaches reference threshold $V_{MR}$.

In this embodiment, $V_{MR}$ is located generally at a midpoint between $V_{TH}$ and $-V_{TH}$. As discussed above, a suitable reference threshold $V_{MRA}$ may be located between such a midpoint and $V_{TH}$, and may accommodate closed-loop delay of current $I_O$ and various frequency of signals within amplifier 10.

Thus, it is apparent that there has been provided in accordance with the present invention, a system and method for improving amplifier efficiency that satisfies the advantages set forth above. Although the present invention has been described in detail, various changes, substitutions, and alterations may be readily ascertainable by those skilled in the art and may be made herein without departing from the spirit and scope of the present invention as defined by the following claims.

What is claimed is:

1. An amplifier, comprising:

an output node;

an input stage amplifier coupled to the output node;

an output stage comprising at least two switching elements coupled to the output node; and a control circuit coupled to the output stage, the control circuit operable to produce a tri-state output from the output stage to the output node in response to a sensed value proportional to an amount of current that flows to the output node from the input stage amplifier.

2. The amplifier of claim 1, wherein the amplifier comprises an audio amplifier.

3. The amplifier of claim 1, wherein the input stage amplifier comprises a class AB amplifier.

4. The amplifier of claim 1, further comprising a threshold circuit operable to measure the current and to generate the sensed value.

5. The amplifier of claim 1, wherein the control circuit comprises:

a first portion operable to control the output stage when the current flows from the input stage to the output node; and a second portion operable to control the output stage when the current flows from the output node to the input stage.

6. The amplifier of claim 1, wherein the control circuit is further operable to:

activate a first switching element of the output stage until the current reaches a second threshold after exceeding a first threshold;

activate a second switching element of the output stage until the current reaches a fourth threshold after exceeding a third threshold; and deactivate the first switching element until the current exceeds the first threshold and deactivating the second switching element until the current exceeds the third threshold.

7. A method for improving amplifier efficiency, comprising the steps of:

providing an input stage amplifier an output stage and an output load coupled to the output stage, the output stage comprising at least two switching elements;

measuring a sensed value proportional to a current flowing from the input stage amplifier to the output load; and producing a tri-state output of the output stage of the amplifier using a control circuit responsive to the sensed value.

8. The method of claim 7, wherein the sensed value comprises a voltage.

9. The method of claim 7, wherein the input stage comprises a class AB input stage.

10. The method of claim 7, wherein the control circuit comprises at least one comparator responsive to the sensed value and operable to control at least a first switching element of the output stage.

11. The method of claim 7, wherein producing a tri-state output comprises:

activating a first switching element of the output stage until the current reaches a second threshold after exceeding a first threshold;

activating a second switching element of the output stage until the current reaches a fourth threshold after exceeding a third threshold; and deactivating the first switching element until the current exceeds the first threshold and deactivating the second switching element until the current exceeds the third threshold.

12. The method of claim 11, wherein the second threshold is the same as the fourth threshold.

13. The method of claim 11, wherein each of the thresholds comprise a voltage proportional to the sensed value.

14. The method of claim 11, wherein the first switching element is activated and deactivated by at least one comparator circuit, and the second switching element is activated and deactivated by at least one additional comparator circuit.

* * * * *